(12) United States Patent
Ku et al.

(10) Patent No.: US 7,834,661 B2
(45) Date of Patent: Nov. 16, 2010

(54) ULTRA-LOW-POWER LEVEL SHIFTER, VOLTAGE TRANSFORM CIRCUIT AND RFID TAG INCLUDING THE SAME

(75) Inventors: Ja-Nam Ku, Yongin-si (KR);
Cheong-Worl Kim, Andong-si (KR);
Young-Hoon Min, Anyang-si (KR);
Dong-Hyun Lee, Seongnam-si (KR);
Il-Jong Song, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/210,634

(22) Filed: Sep. 15, 2008

(65) Prior Publication Data

US 2009/0128191 A1     May 21, 2009

Related U.S. Application Data

(63) Continuation-in-part of application No. 11/358,029, filed on Feb. 22, 2006, now abandoned.

(30) Foreign Application Priority Data

Feb. 22, 2005     (KR) ...................... 10-2005-0014398

(51) Int. Cl.
*H03K 19/0175* (2006.01)
(52) U.S. Cl. .............................. 326/68; 326/81; 326/83; 327/108; 327/333
(58) Field of Classification Search ............. 326/62–68, 326/80–81, 86–87, 83; 327/157, 148, 333, 327/108, 109, 112
See application file for complete search history.

(56) References Cited

U.S. PATENT DOCUMENTS

| | | | | |
|---|---|---|---|---|
| 5,537,059 A | * | 7/1996 | Asahina | 326/81 |
| 5,568,081 A | * | 10/1996 | Lui et al. | 327/380 |
| 6,028,449 A | * | 2/2000 | Schmitt | 326/80 |
| 6,049,228 A | * | 4/2000 | Moon | 326/81 |
| 6,353,333 B1 | * | 3/2002 | Curd et al. | 326/81 |
| 6,359,493 B2 | | 3/2002 | Satomi | |
| 6,535,020 B1 | * | 3/2003 | Yin | 326/83 |
| 6,956,401 B1 | * | 10/2005 | Tyhach et al. | 326/80 |
| 6,956,771 B2 | * | 10/2005 | Sarig et al. | 365/185.18 |

OTHER PUBLICATIONS

Sedra/Smith, "Microelectronic Circuits", 2004 Oxford University Press, 5th Edition, p. 10-11.

* cited by examiner

*Primary Examiner*—Rexford N Barnie
*Assistant Examiner*—Christopher Lo
(74) *Attorney, Agent, or Firm*—Sughrue Mion, PLLC

(57) ABSTRACT

A level shifter increase a voltage level of an output signal with relatively lower power consumption by adopting current-starved configuration. The level shifter includes an input unit and a driving unit. The input unit includes a current-starved inverter configured to generate a control signal in response to an input signal and a bias voltage. The input unit is powered by a first power supply voltage. The driving unit generates an output signal in response to the control signal. The output signal has a voltage level higher than the input signal, and the driving unit is powered by a second power supply voltage higher than the first power supply voltage.

10 Claims, 5 Drawing Sheets

ULTRA-LOW-POWER LEVEL SHIFTER, VOLTAGE TRANSFORM CIRCUIT AND RFID TAG INCLUDING THE SAME

CROSS-REFERENCE TO RELATED APPLICATIONS

This application is a continuation-in-part of U.S. patent application Ser. No. 11/358,029, filed on Feb. 22, 2006, now pending, which claims benefit under 35 U.S.C. §119 from Korean Patent Application No. 2005-14398, filed on Feb. 22, 2005, the entire content of which is incorporated herein by reference.

BACKGROUND

1. Technical Field

Apparatuses and methods consistent with the present invention relates in general to a level shifter, and more specifically, to an ultra-low-power level shifter constituted by CMOS elements, a voltage transform circuit and an RFID (radio frequency identification) tag including the ultra-low-power level shifter.

2. Description of the Related Art

In some cases, a system needs to transform an external low voltage to a higher voltage. That is, in the case where a voltage required for driving a specific configuration of a circuit element is higher than an externally supplied voltage, it is necessary to transform the externally supplied voltage into the required driving voltage. For instance, a minimum voltage of about 15V is required for driving a nonvolatile memory, whereas an externally supplied voltage is typically about 1.5V. Therefore, in order to drive the memory, the externally supplied voltage 1.5V should be transformed to 15V.

Figure 1:
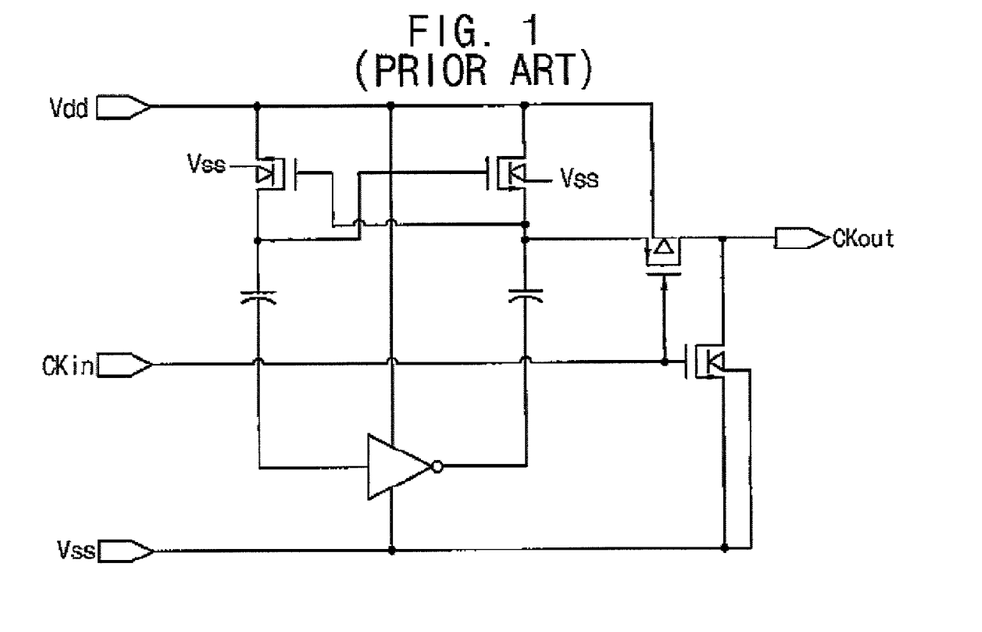
FIG. 1 is a circuit diagram of a conventional level shifter for transforming a lower voltage signal to a higher voltage signal.

FIG. 1 illustrates a conventional level shifter for transforming an external lower voltage signal CKin to a higher voltage signal CKout. The following description is based on this level shifter of FIG. 1.

As shown in the drawing, the level shifter receives an externally supplied power voltage Vdd and the lower voltage signal CKin, and outputs the level-shifted signal CKout. The voltage levels of Vdd and CKout satisfy the relationship shown in Equation 1 below.

$$\frac{CKout}{Vdd} = 2 \qquad \text{[Equation 1]}$$

As shown in Equation 1, CKout is dependent on Vdd. That is, if Vdd is small, CKout is also small. Thus, if CKout is used as an input signal of a charge pump for generating a high voltage, the number of pumping stages of the charge pump is increased to transform an input power voltage to a required high voltage. As a result, the circuit efficiency is lowered.

SUMMARY

Illustrative, non-limiting embodiments of the present invention overcome the above disadvantages and other disadvantages not described above. Also, the present invention is not required to overcome the disadvantages described above, and an illustrative, non-limiting embodiment of the present invention may not overcome any of the problems described above. Apparatuses and methods consistent with the present invention provide a level shifter that is capable of increasing a voltage level of an output signal to a desired magnitude.

An aspect of an embodiment of the present invention is to provide a level shifter which is capable of providing pump clock pulses having a relatively higher voltage level to a charge pump, thereby improving the efficiency of the charge pump.

Another aspect of an embodiment of the present invention is to provide a method for reducing the number of pumping stages of a charge pump by increasing the voltage level of the pump clock pulses input to the charge pump.

In an illustrative, non-limiting embodiment of the present invention, there is provided a level shifter, including an input unit and a driving unit. The input unit includes a current-starved inverter configured to generate a control signal in response to an input signal and a bias voltage. The input unit is powered by a first power supply voltage. The driving unit generates an output signal in response to the control signal, where the output signal has a voltage level higher than the input signal. The driving unit is powered by a second power supply voltage that is higher than the first power supply voltage.

The current-starved inverter may include a metal oxide semiconductor (MOS) transistor configured to reduce an operation current of the current-starved inverter in response to the bias voltage.

In some embodiments, the current-starved inverter may include a P-type MOS (PMOS) current-starving transistor coupled to the first power supply voltage, an N-type MOS (NMOS) current-starving transistor coupled to a ground voltage, and an inverter coupled between the PMOS current-starving transistor and the NMOS current-starving transistor. In this case, the PMOS current-starving transistor may reduce a sourcing current of the inverter in response to a first bias voltage, and the NMOS current-starving transistor may reduce a sinking current of the inverter in response to a second bias voltage.

In some embodiments, the driving unit may include a current mirror configured to pull up a voltage level of the output signal in response to the control signal, and an NMOS driving transistor configured to pull down the voltage level of the output signal in response to the control signal. The driving unit may further include an NMOS current-starving transistor coupled between the current mirror and a ground voltage, where the NMOS current-starving transistor is configured to reduce a bias current of the current mirror in response to the bias voltage.

In some embodiments, the input unit may include a first current-starved inverter configured to generate a first control signal in response to the input signal and the bias voltage, and a second current-starved inverter configured to generate a second control signal in response to the input signal and the bias voltage.

The driving unit may include a current mirror coupled to the second power supply voltage, where the current mirror is configured to pull up a voltage level of the output signal in response to the first control signal, and an NMOS driving transistor coupled to a ground voltage, where the NMOS driving transistor is configured to pull down the voltage level of the output signal in response to the second control signal. The driving unit may further include an NMOS current-starving transistor coupled between the current mirror and a ground voltage, where the NMOS current-starving transistor is configured to reduce a bias current of the current mirror in response to the bias voltage.

In an illustrative, non-limiting embodiment of the present invention, there is provided a voltage transform circuit including a level shifter and a charge pump. The level shifter adopts current-starved configuration as described above, where the output signal of the level shifter corresponds to a level-shifted pump clock pulse. The charge pump boosts an input voltage to generate an output voltage higher than the input voltage in response to the level-shifted pump clock pulse.

In an illustrative, non-limiting embodiment of the present invention, there is provided a radio frequency identification (RFID) tag including a voltage transform circuit, a power generator, and a nonvolatile memory device. The voltage transform circuit is implemented in current-starved configuration as described above. The power generator generates the first and second power supply voltages provided to the voltage transform circuit. The nonvolatile memory device receives the output voltage of the voltage transform circuit.

BRIEF DESCRIPTION OF THE DRAWINGS

Aspects and features of the present invention will be more apparent by describing certain illustrative, non-limiting embodiments of the present invention with reference to the accompanying drawings, in which.

DETAILED DESCRIPTION OF EXEMPLARY EMBODIMENTS

Illustrative non-limiting embodiments of the present invention are described below with reference to the accompanying drawings.

In general, the passive RFID (radio frequency identification) tag is powered using electromagnetic wave from an external device such as an RF reader. In this case, the tag rectifies the received electromagnetic wave to generate a relatively high power voltage Vaa, which may be referred to as an analog voltage. The tag regulates the analog voltage Vaa to generate a relatively low power voltage Vdd, which may be referred to as a digital voltage. The embodiments of the present invention described here provide methods for shifting a voltage level of an input signal using an analog power supply instead of a digital power supply and transforming an input voltage to a high voltage using the level-shifted signal. First, a charge pump is explained below. A charge pump is a circuit for temporarily supplying a voltage higher than an input power supply voltage. Nowadays a semiconductor memory device tends to have a lower power level to reduce energy consumption. Especially, a flash memory device requires a charge pump generating a high voltage for use in erasing data and programs in the flash memory.

Figure 2:
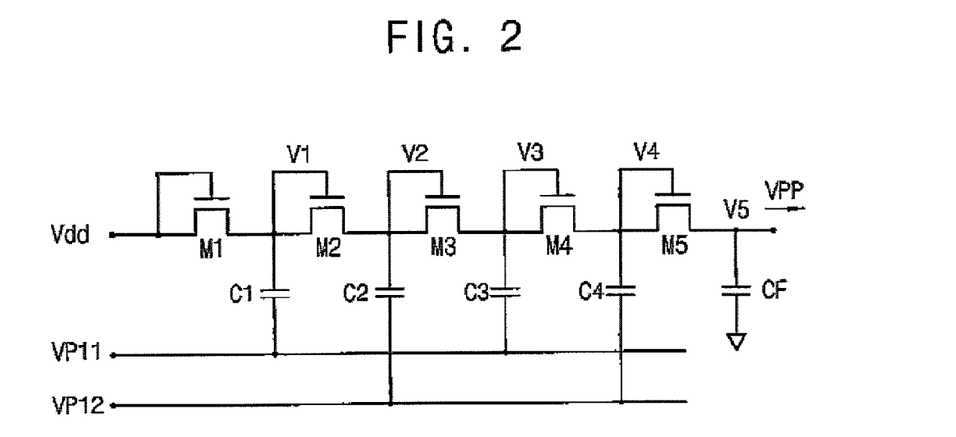
FIG. 2 illustrates an example of a Dickson charge-pump circuit.

FIG. 2 illustrates the Dickson charge pump as an example of a charge pump, in which the number of pumping stages is four.

The Dickson charge pump (circuit) includes a first MOS transistor M1 to which an external power supply voltage Vdd is applied, and second to fifth MOS transistors M2-M5 to which pumping clock pulses VP11, VP12 are applied. Pumping clock pulses VP11 and VP12 have different phases generated by an external oscillator (not shown) and are alternately applied through pump capacitors C1-C4. A charge storage capacitor Cf is connected to an output terminal of the fifth transistor M5. The high voltage Vpp at the output terminal is provided as an output.

Figure 3:
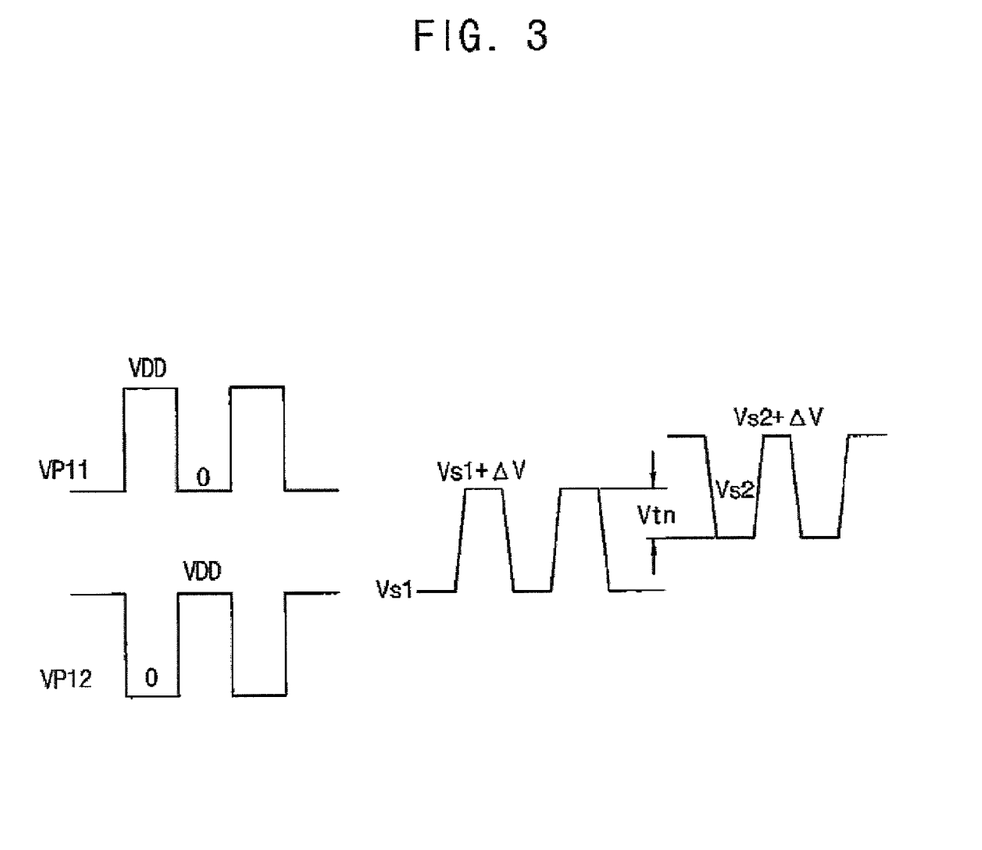
FIG. 3 illustrates the operation of the Dickson charge-pump circuit.

With reference to FIG. 3, the following describes the operation of the Dickson charge pump (circuit) shown in FIG. 2.

The pump clock pulses VP11, VP12, each having a frequency of about 60 MHz, are supplied from the external oscillator and are set to the same magnitude as the external power supply voltage Vdd. These pump clock pulses have a phase difference of 180° from each other. The MOS transistors M1-M5 function as diodes, hence, charge increases in only one direction.

Those two pump clock pulses VP11 and VP12 passing through the pump capacitors C1-C4, which are coupling capacitors, apply charge in a direction such that the charge increases through the MOS transistors M2-M5.

For instance, when the pump clock pulse VP11 transitions from 'low' to 'high', and the pump clock pulse VP12 transitions from 'high' to 'low', a voltage V1 applied to a gate electrode of the MOS transistor M2 is increased to Vs1+Δv as shown in FIG. 3 by the pumping operation of the pump clock pulse VP11 through the capacitor C1, and the voltage V2 applied to a gate side of the MOS transistor M3 is fixed at the value of Vs2.

The voltage Vs1 and the voltage Vs2 indicate a steady-state voltage of the voltage V1 and the voltage V2, respectively, and Δv indicates a very small voltage increment resulting from the pumping operation.

In this case, the MOS transistors M1, M3 are in a reverse bias state, and charge moves from the voltage V1 state to the voltage V2 state through MOS transistor M2. Here, the requirement for charge pumping is that Δv must be greater than a threshold voltage Vth of MOS transistor M2, as expressed below.

$$\Delta v > Vth \quad \text{[Equation 2]}$$

A pumping gain Gv2 at the second level is defined as a difference between the voltage V1 and the voltage V2 as expressed below.

$$Gv2 = V2 - V1 = \Delta v - Vth \quad \text{[Equation 3]}$$

However, in Equation 3, the pumping gain is higher than the frequency of a clock, so the voltage V2 becomes smaller than an expected value.

In like manner, when the pump clock pulse VP11 transitions from 'high' to 'low', and the pump clock pulse VP12 transitions from 'low' to 'high', charge moves from the voltage V2 state to the voltage V3 state through MOS transistor M3.

The above-described operation is performed equally in the other MOS transistors M3-M5, so that the voltage V5 present at a final terminal is higher than the applied power supply voltage Vdd.

A desired magnitude of an output high voltage Vpp can be obtained by increasing the number of MOS transistors, that is, the number of pumping stages, or by increasing the magnitude of the applied power supply voltage Vdd and/or the voltage level of the pump clock pulses VP11, VP12. However, when the number of MOS transistors is increased, the efficiency of the charge pump (circuit), which consumes a large amount of current, is lowered. Also the power supply voltage Vdd is limited in some devices such as the RFID tag. To overcome this drawback, a method is described here for increasing the voltage level of the pump clock pulses VP11, VP12, which is applied to the charge pump (circuit).

Figure 4:
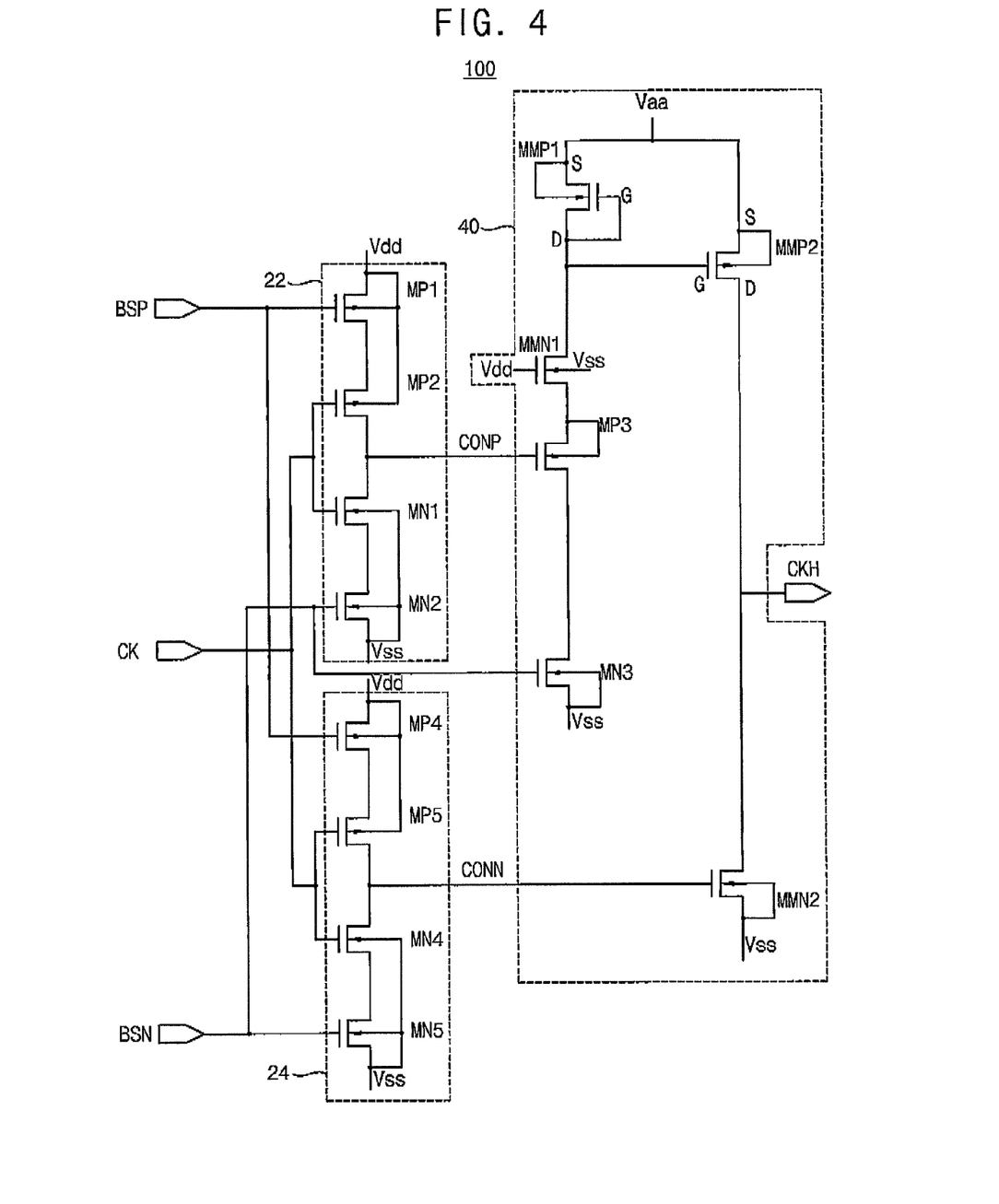
FIG. 4 is a circuit diagram of a level shifter for transforming a lower voltage signal to a higher voltage signal, according to an embodiment of the present invention.

FIG. 4 is a circuit diagram of a level shifter for transforming a lower voltage signal to a higher voltage signal, according to an embodiment of the present invention. Referring to FIG. 4, a level shifter 100 includes an input unit and a driving unit 40. The input unit includes at least one current-starved inverter 22, 24 for reducing power consumption of the level shifter 100. The current-starved inverter 22, 24 generates a control signal CONP, CONN in response to an input signal CK and a bias voltage BSP, BSN. The input unit is powered by a first power supply voltage Vdd. The input signal CK may be a clock signal swinging between the first power supply voltage Vdd and a ground voltage Vss. The driving unit 40 generates an output signal CKH in response to the control signal CONP, CONN. The driving unit 40 is powered by a second power supply voltage Vaa that is higher than the first power supply voltage Vdd, and thus the output signal CKH has a voltage level higher than the input signal CK. In case where the input signal CK is a clock signal, the output signal CKH is also a clock signal swinging between the second power supply voltage Vaa and a ground voltage Vss.

Each of the first and second current-starved inverters 22, 24 may include a metal oxide semiconductor (MOS) transistor MP1, MN2, MP4, MN5 for reducing an operation current of the current-starved inverters 22, 24 in response to the bias voltage BSP, BSN.

In some embodiments, the input unit may include two current-starved inverters 22 and 24 as illustrated in FIG. 4. In other embodiments, the input unit may include a single current-starved inverter. In this case, two control signals CONP and CONN may be substantially identical to each other. Hereinafter, the level shifter using two current-starved inverters 22, 24 are described with reference to FIG. 4.

The first current-starved inverter 22 generates a first control signal CONP in response to the input signal CK and the bias voltage BSP, BSN, and the second current-starved inverter 24 generates a second control signal CONN in response to the input signal CK and the bias voltage BSP, BSN. Each of the first and second current-starved inverters 22, 24 may include a P-type MOS (PMOS) current-starving transistor MP1, MP4, an N-type MOS (NMOS) current-starving transistor MN2, MN5, and an inverter MP2/MN1, MP5/MN4. The first current-starved inverter 22 and the second current-starved inverter 24 may have similar configuration to each other.

In the first current-starved inverter 22, the PMOS current-starving transistor MP1 is coupled to the first power supply voltage Vdd, and reduces a sourcing current in response to a first bias voltage BSP. The sourcing current is a current flowing through the transistors MP1 and MP2 by the first power supply voltage Vdd when the input signal CK has a logic low level. The NMOS current-starving transistor MN2 is coupled to a ground voltage Vss, and reduces a sinking current in response to a second bias voltage BSN. The sinking current is a current flowing into a ground terminal through the transistors MN1 and MN2 when the input signal CK has a logic high level. The inverter MP2/MN1 is coupled between the PMOS current-starving transistor MP1 and the NMOS current-starving transistor MN2. The inverter MP2/MN1 generates the first control signal CONP in response to the input signal CK using the reduced sourcing and sinking currents. As such, the inverter MP5/MN4 in the second current-starved inverter 24 generates the second control signal CONN in response to the input signal CK using the reduced sourcing and sinking currents.

The driving unit 40 may adopt current biasing with a current mirror and an NMOS driving transistor MMN2 as illustrated in FIG. 4. The current mirror may include a diode-connected transistor MMP1, a PMOS driving transistor MMP2, and a control transistor MP3. A passing transistor MMN1 may be biased with the first power supply voltage Vdd and may be omitted in some embodiments. The current mirror is coupled to the second power supply voltage Vaa, and pulls up a voltage level of the output signal CKH in response to the first control signal CONP. The NMOS driving transistor MMN2 is coupled to a ground voltage Vss, and pulls down the voltage level of the output signal CKH in response to the second control signal CONN.

When the input signal CK has a logic high level, the control signals CONP and CONN have a logic low level. Thus the control transistor MP3 in the current mirror is turned on and the NMOS driving transistor MMN2 is turned off. In this case, the bias current flows through the transistors MMP1 and MP3, a mirrored current flows through the PMOS driving transistor MMP2, and thus a voltage level of the output signal CKH is pulled up to substantially the second power supply voltage Vaa.

When the input signal CK has a logic low level, the control signals CONP and CONN have a logic high level. Thus the control transistor MP3 in the current mirror is turned off and the NMOS driving transistor MMN2 is turned on. In this case, the bias current and the mirrored current are not caused, a current flows to ground through the NMOS driving transistor MMN2, and thus the voltage level of the output signal CKH is pulled down to substantially the ground voltage Vss.

As such, one of the PMOS driving transistor MMP2 and the NMOS driving transistor MMN2 is selectively turned on and thus a short current flowing through both of the transistors MMP2 and MMN2 may be prevented.

In some embodiments, the driving unit 40 may further include an NMOS current-starving transistor MN3 that is coupled between the current mirror and the ground voltage Vss. The NMOS current-starving transistor MN3 reduces the bias current of the current mirror in response to the second bias voltage CONN.

The level shifter 100 uses inverters of current-staved type capable of reducing the operation currents of the inverters and/or a current source such as the control transistor MN3 capable of reducing the bias current of the current mirror, and thus power consumption of the level shifter 100 may be reduced. Furthermore, unlike the conventional art, the level shifter 100 excludes a capacitor. When a level shifter uses a capacitor, a time constant (RC) is increased, thereby degrading performance of devices such as an RFID tag that operates at high frequency.

Figure 5:
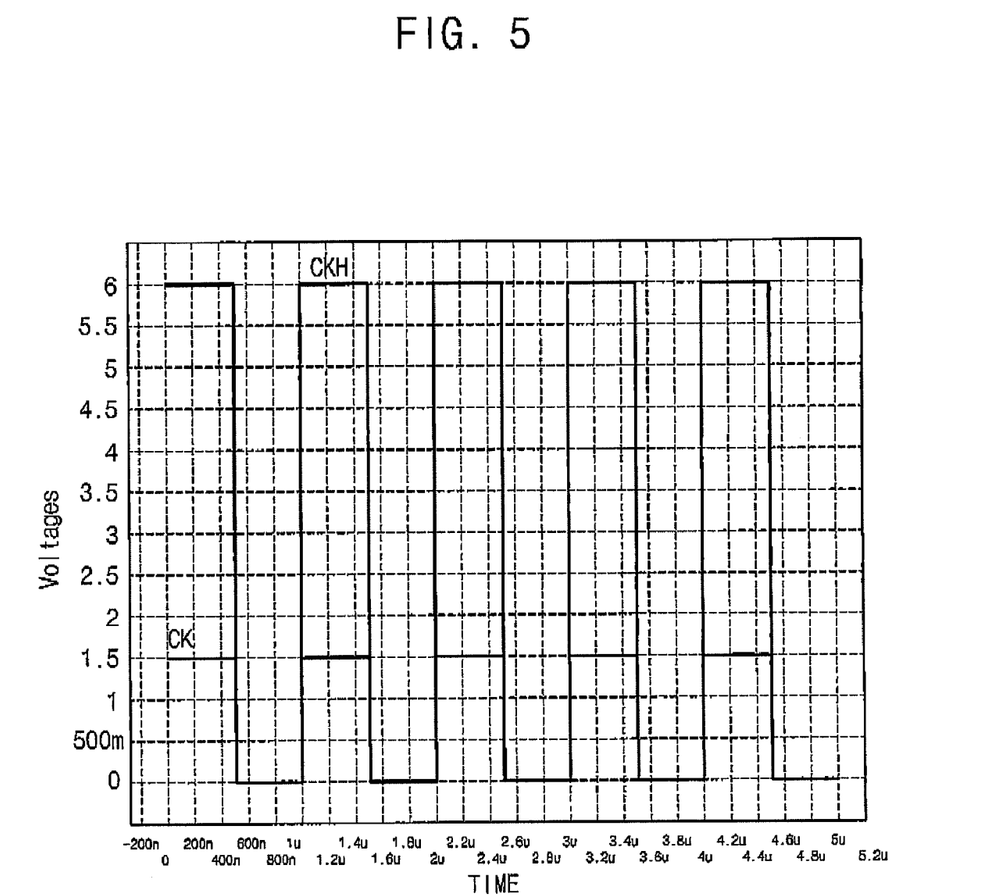
FIG. 5 is a voltage chart illustrating an input lower voltage signal and an output higher voltage signal to and from a level shifter according to an embodiment of the present invention.

FIG. 5 is a voltage chart showing a relationship between the input signal CK and the output signal CKH of the level shifter of FIG. 4 according to an embodiment of the present invention. As shown in FIG. 5, when the voltage level of the input signal CK is 1.5V, the voltage level of the output signal CKH may be shifted up to 6V using the second power supply voltage Vaa. The input and output signals CK and CKH are in phase with one another. As mentioned above, the first power supply voltage Vdd and the second power supply voltage Vaa may be a digital voltage and an analog voltage used in the RFID tag. In the related art, when the first power supply voltage Vdd is 1.5V, the voltage level of the output signal CKout is 3V. However, by using the analog voltage Vaa higher than the digital voltage Vdd, it becomes possible to further increase the voltage level of the output signal CKH.

Figure 6:
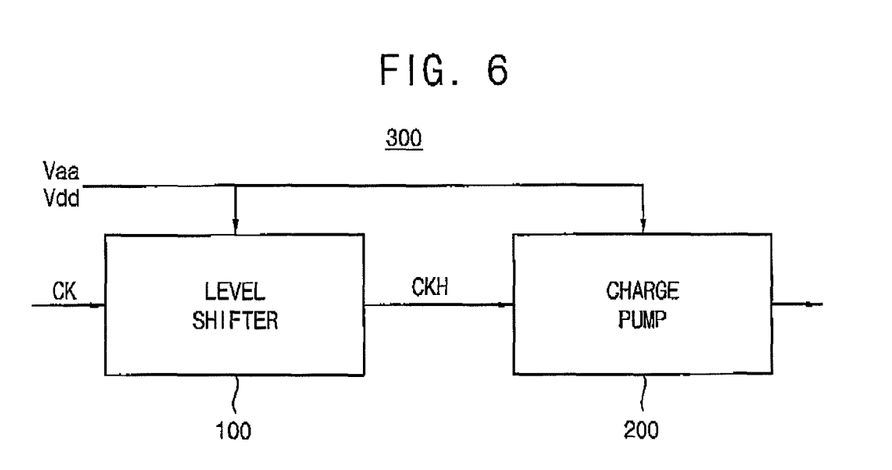
FIG. 6 is a block diagram of a voltage transform circuit according to an embodiment of the present invention.

FIG. 6 is a block diagram of a voltage transform circuit according to an embodiment of the present invention. Referring to FIG. 6, a voltage transform circuit 300 includes a level shifter 100 and a charge pump 200. The level shifter 100 adopts a current-starved configuration as illustrated in FIG. 4. For example, the charge pump 200 may be implemented with the Dickson charge pump of FIG. 2 and the output signal CKH of the level shifter 100 having a shifted voltage level may be provided as the pump clock pulse VP11, VP12 in FIG. 2. The charge pump 200 boosts an input voltage Vdd or Vaa to generate an output voltage Vpp higher than the input voltage in response to the level-shifted pump clock pulse CKH. By using the level-shifted pump clock pulse from the level shifter 100, the number of pumping stages in the charge pump 200 may be reduced. For example, the output voltage Vpp may be used for operating a nonvolatile memory device included in an RFID tag.

Figure 7:
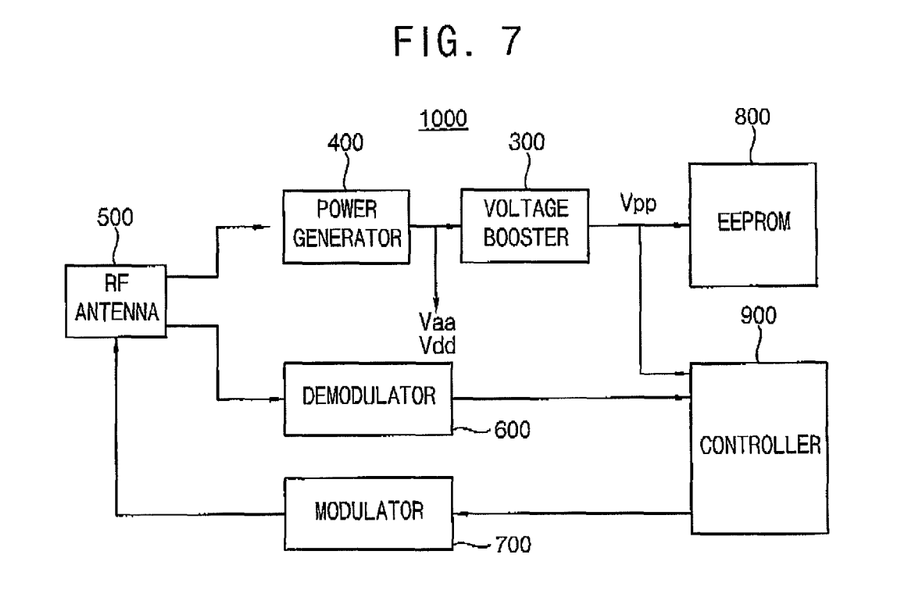
FIG. 7 is a block diagram of an RFID tag according to an embodiment of the present invention.

FIG. 7 is a block diagram of an RFID tag according to an embodiment of the present invention. Referring to FIG. 7, an RFID tag 1000 includes an RF antenna 500, a demodulator 600, a modulator 700, and a controller 900 as conventional tags. Particularly the RFID tag 1000 includes a nonvolatile memory device 800 such as an electrically erasable programmable read-only memory (EEPROM) that operates based on a relatively high voltage. In this case, the RFID tag 1000 requires a voltage booster 300 for providing the relatively high voltage to the nonvolatile memory device 800 and the controller 900. A power generator 400 rectifies received electromagnetic wave to generate an analog voltage Vaa and regulates the analog voltage Vaa to generate a digital voltage Vdd lower than the analog voltage Vaa. The voltage booster 300 may be implemented with the voltage transform circuit as illustrated in FIG. 6. The voltage level of the pump clock pulses may be increased using the level shifter adopting current-starved configuration according to example embodiments, and the high voltage Vpp may be generated using the charge pump having a relatively smaller number of pumping stages.

As explained so far, the level shifter reduces power consumption by adopting current-starved configuration. Since the voltage level of the output signal from the level shifter of FIG. 4 is higher than that of the related art, the number of pumping stages of the charge pump can be reduced. This in turn reduces power consumption at the charge pump, and the efficiency of the charge pump and the RFID tag including the charge pump can be improved.

The foregoing embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A level shifter, comprising:
an input unit including a current-starved inverter configured to generate a control signal in response to an input signal and a bias voltage, the input unit being powered by a first power supply voltage; and
a driving unit configured to generate an output signal in response to the control signal, the output signal having a voltage level higher than the input signal, the driving unit being powered by a second power supply voltage higher than the first power supply voltage,
wherein the driving unit comprises:
a current mirror configured to pull up a voltage level of the output signal in response to the control signal; and
an NMOS driving transistor configured to pull down the voltage level of the output signal in response to the control signal,
wherein the current-starved inverter comprises:
a P-type MOS (PMOS) current-starving transistor coupled to the first power supply voltage;
an N-type MOS (NMOS) current-starving transistor coupled to a ground voltage; and
an inverter coupled between the PMOS current-starving transistor and the NMOS current-starving transistor.

2. The level shifter of claim 1, wherein the current-starved inverter comprises a metal oxide semiconductor (MOS) transistor configured to reduce an operation current of the current-starved inverter in response to the bias voltage.

3. The level shifter of claim 1, wherein the PMOS current-starving transistor is configured to reduce a sourcing current of the inverter in response to a first bias voltage, and the NMOS current-starving transistor is configured to reduce a sinking current of the inverter in response to a second bias voltage.

4. The level shifter of claim 1, wherein the driving unit further comprises:
an NMOS current-starving transistor coupled between the current mirror and a ground voltage, the NMOS current-starving transistor being configured to reduce a bias current of the current mirror in response to the bias voltage.

5. The level shifter of claim 1, wherein the input unit comprises:
a first current-starved inverter configured to generate a first control signal in response to the input signal and the bias voltage; and
a second current-starved inverter configured to generate a second control signal in response to the input signal and the bias voltage.

6. A level shifter, comprising:
an input unit including a current-starved inverter configured to generate a control signal in response to an input signal and a bias voltage, the input unit being powered by a first power supply voltage; and
a driving unit configured to generate an output signal in response to the control signal, the output signal having a voltage level higher than the input signal, the driving unit being powered by a second power supply voltage higher than the first power supply voltage,
wherein the driving unit comprises:
a current mirror configured to pull up a voltage level of the output signal in response to the control signal; and
an NMOS driving transistor configured to pull down the voltage level of the output signal in response to the control signal;
wherein the input unit comprises:
a first current-starved inverter configured to generate a first control signal in response to the input signal and the bias voltage; and
a second current-starved inverter configured to generate a second control signal in response to the input signal and the bias voltage, and
wherein each of the first and second current-starved inverters comprises:
a PMOS current-starving transistor coupled to the first power supply voltage, the PMOS current-starving transistor being configured to reduce a sourcing current in response to a first bias voltage;

an NMOS current-starving transistor coupled to a ground voltage, the NMOS current-starving transistor being configured to reduce a sinking current in response to a second bias voltage; and an inverter coupled between the PMOS current-starving transistor and the NMOS current-starving transistor, the inverter being configured to generate the first or second control signal in response to the input signal using the reduced sourcing and sinking currents.

7. The level shifter of claim 5, wherein the driving unit comprises:

a current mirror coupled to the second power supply voltage, the current mirror being configured to pull up a voltage level of the output signal in response to the first control signal; and an NMOS driving transistor coupled to a ground voltage, the NMOS driving transistor being configured to pull down the voltage level of the output signal in response to the second control signal.

8. The level shifter of claim 7, wherein the driving unit further comprises:

an NMOS current-starving transistor coupled between the current mirror and a ground voltage, the NMOS current-starving transistor being configured to reduce a bias current of the current mirror in response to the bias voltage.

9. A voltage transform circuit, comprising:

the level shifter as claimed in claim 1, the output signal of the level shifter corresponding to a level-shifted pump clock pulse; and a charge pump configured to boost an input voltage to generate an output voltage higher than the input voltage in response to the level-shifted pump clock pulse.

10. A radio frequency identification (RFID) tag, comprising:

the voltage transform circuit as claimed in claim 9, a power generator configured to generate the first and second power supply voltages provided to the voltage transform circuit; and a nonvolatile memory device receiving the output voltage of the voltage transform circuit.

* * * * *